United States Patent [19]

White

[11] 4,149,128
[45] Apr. 10, 1979

[54] CHARGE TRANSFER DEVICE TRANSVERSAL FILTER HAVING ELECTRONICALLY CONTROLLABLE WEIGHTING FACTORS

[75] Inventor: James M. White, Mahopac, N.Y.

[73] Assignee: International Business Machines Corporation, Armonk, N.Y.

[21] Appl. No.: 811,748

[22] Filed: Jun. 30, 1977

[51] Int. Cl.² ............... H03H 7/28; H01L 27/10; H01L 29/78; G11C 19/28
[52] U.S. Cl. ............... 333/165; 307/221 D; 357/24
[58] Field of Search ............... 333/70 T, 18, 28 R; 357/24; 307/221 R, 221 C, 221 D, 304; 328/167, 37

[56] References Cited

U.S. PATENT DOCUMENTS

| | | | |
|---|---|---|---|
| 3,819,958 | 6/1974 | Gosney | 307/304 |
| 4,032,867 | 6/1977 | Engeler et al. | 333/70 T |

Primary Examiner—Alfred E. Smith
Assistant Examiner—Marvin Nussbaum
Attorney, Agent, or Firm—Ronald L. Drumheller

[57] ABSTRACT

A charge transfer device transversal filter is provided having electronically controllable weighting factors. Two equivalent and corresponding charge transfer device shift registers have floating electrodes sandwiched between the sensing electrodes and the substrate for biasing the underlying depletion regions and thereby controlling the effective capacitances thereof. Depletion capacitances are controlled so as to produce desired weighting factors when corresponding and otherwise equal charging currents are substrated one from the other.

1 Claim, 11 Drawing Figures

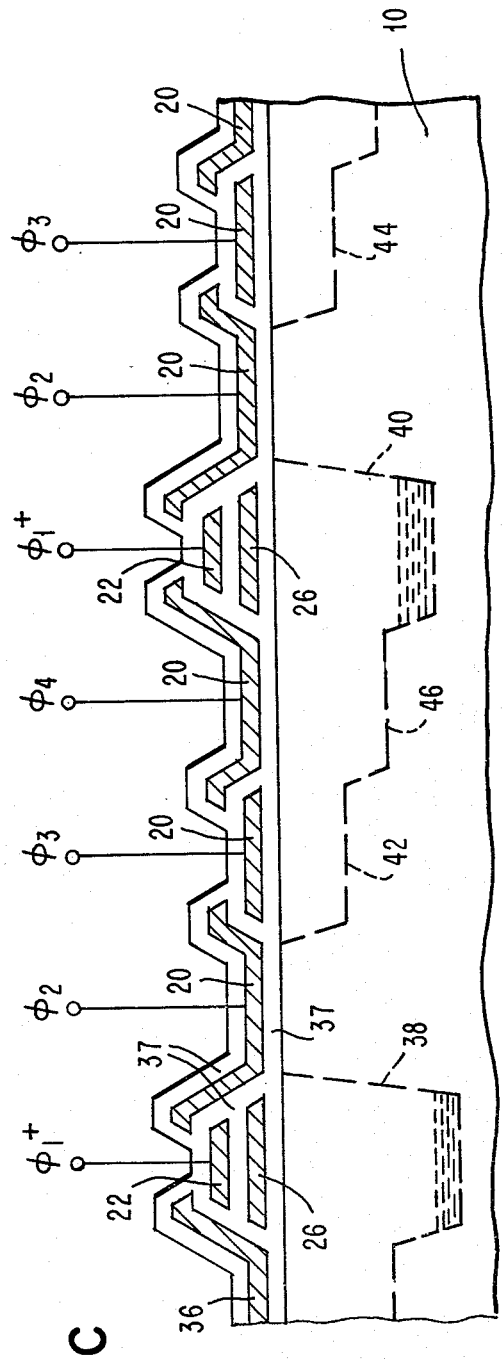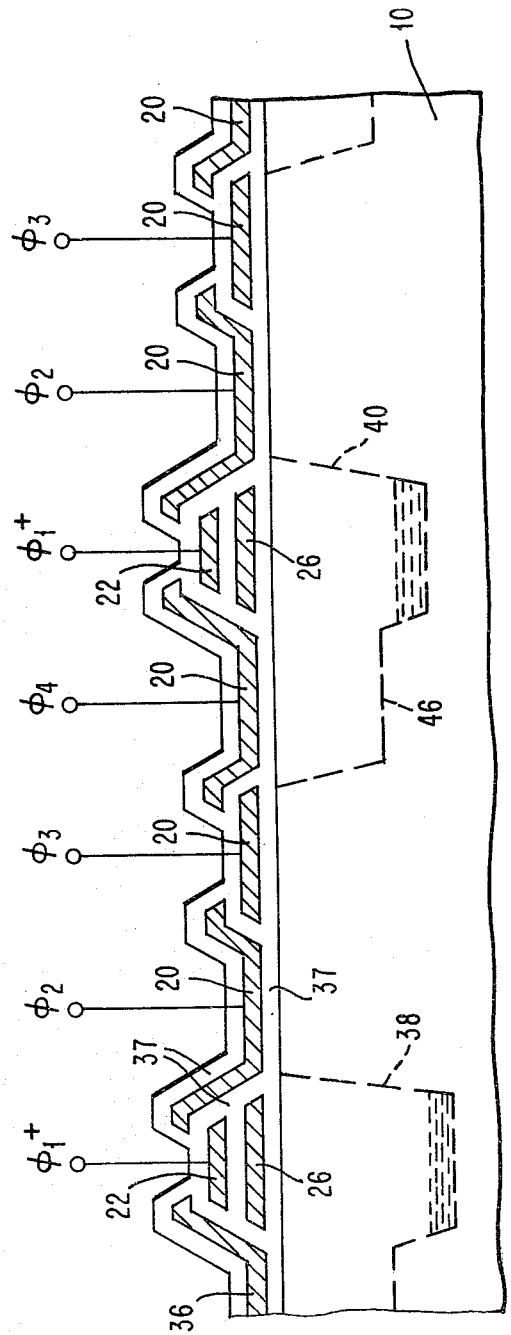

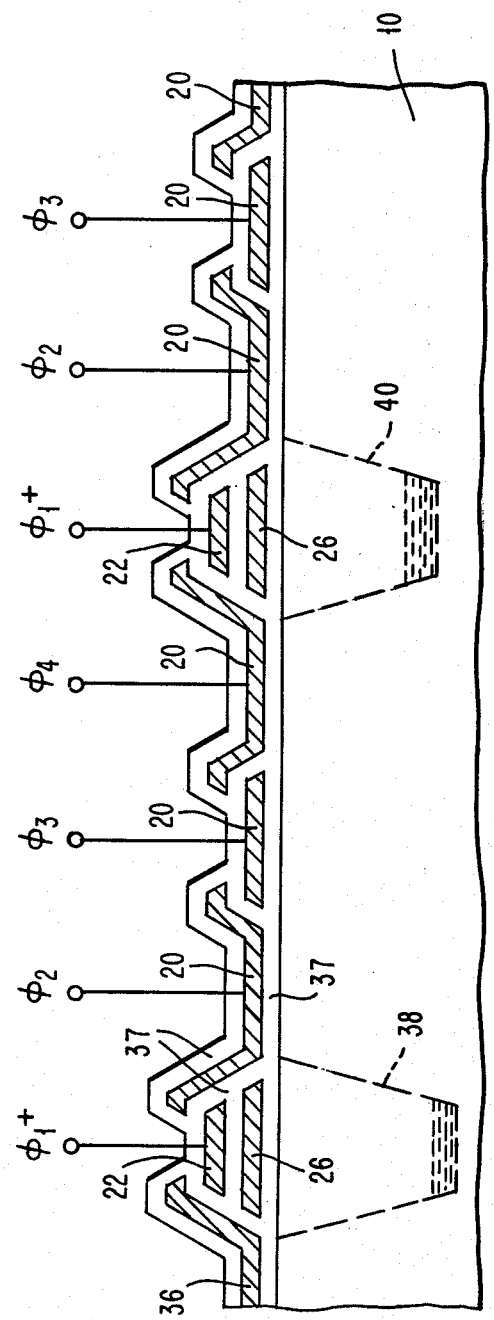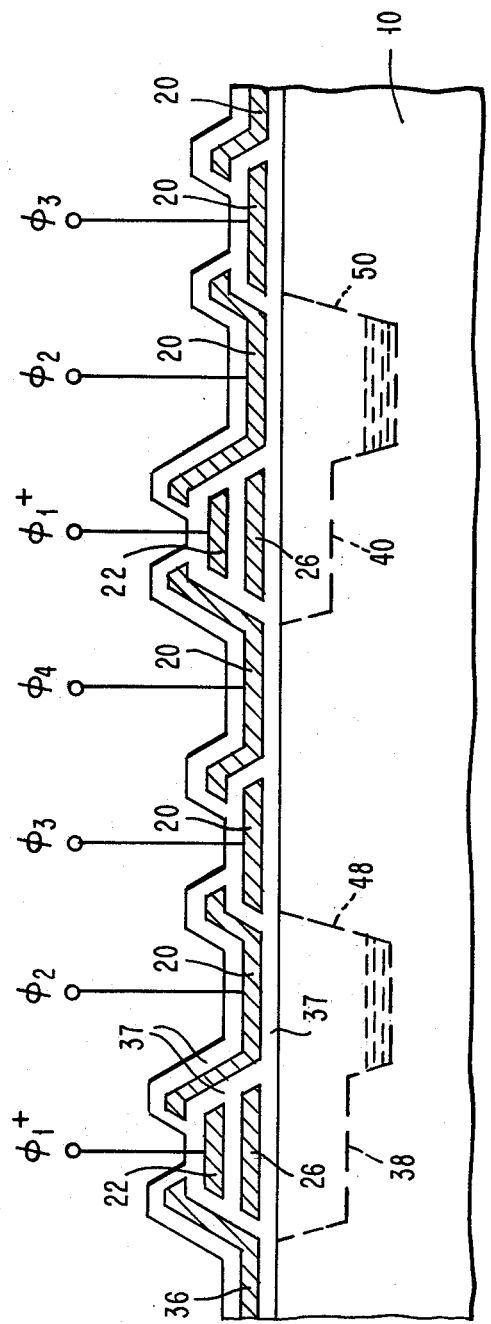

CHARGE TRANSFER DEVICE TRANSVERSAL FILTER HAVING ELECTRONICALLY CONTROLLABLE WEIGHTING FACTORS

BACKGROUND OF THE INVENTION

1. Field of the Invention

This invention relates to transversal filters employing charge transfer technology, and more particularly, to a programmable or adaptable charge transfer device transversal filter having a floating electrode under each sensing electrode for controlling the associated depletion capacitance in order to introduce weighting factors.

2. Description of the Prior Art

A transversal filter convolves an incoming signal with the impulse response of the filter. The convolution can be performed by applying the incoming signal to the input of a charge transfer device analog shift register and forming a weighted summation of the charge at each stage of the register. Ordinarily, the signals at each stage of the shift register are tapped or sampled, multiplied by "weighting factors" and then added or summed.

Transversal filters having adjustable weighting factors are known. Charge transfer device transversal filters with adjustable weighting factors are also known, but the charge signal is first sensed and then weighted as a separate circuit function external to the charge transfer cell. Charge transfer device transversal filters which have weighting factors associated with the charge sensing are also known but the weighting factors are not programmable or electronically adjustable. U.S. Pat. No. 3,819,958 is exemplary of such nonprogrammable charge transfer transversal filters. Each is characterized by split transfer electrodes which introduce invariable weighting factors determined by relative areas of the resulting electrode portions. No known charge transfer transversal filter employs floating electrodes under the sensing electrodes to bias depletion regions in order to control depletion capacitances for a weighting purpose or for any other purpose.

SUMMARY OF THE INVENTION

An object of the present invention is to provide an improved transversal filter having adjustable weighting factors.

Another object of the present invention is to provide a charge coupled device transversal filter having electronically controllable weighting factors.

A further object is to provide a charge coupled device transversal filter wherein weighting factors are determined by the effective depletion layer capacitances.

Still another object is to electronically control the effective depletion layer capacitances in a charge coupled device transversal filter for the purpose of electronically controlling weighting factors.

It is also an object of this invention to provide a charge coupled device transversal filter having floating electrodes between the sensing electrodes and the associated depletion regions for the purpose of controlling the effective capacitances of the associated depletion regions in order to introduce weighting factors which might be controlled electronically.

A further object is to introduce equal charge into depletion regions of different effective capacitance thereby causing a difference in charging currents which might be directly sensed as the stored charge multiplied by a weighting factor.

Another object is to sum such differences in charging currents corresponding to discrete input signals so as to form a convolution integral thereof with a transfer function determined by the effective depletion layer capacitances.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIGS. 3B, 3C, 3D, 3E, 3F, and 3G illustrate the operation of the preferred embodiment by showing potential well relationships and charge packet flow during a timed sequence.

DESCRIPTION OF THE PREFERRED EMBODIMENT

Figure 1:
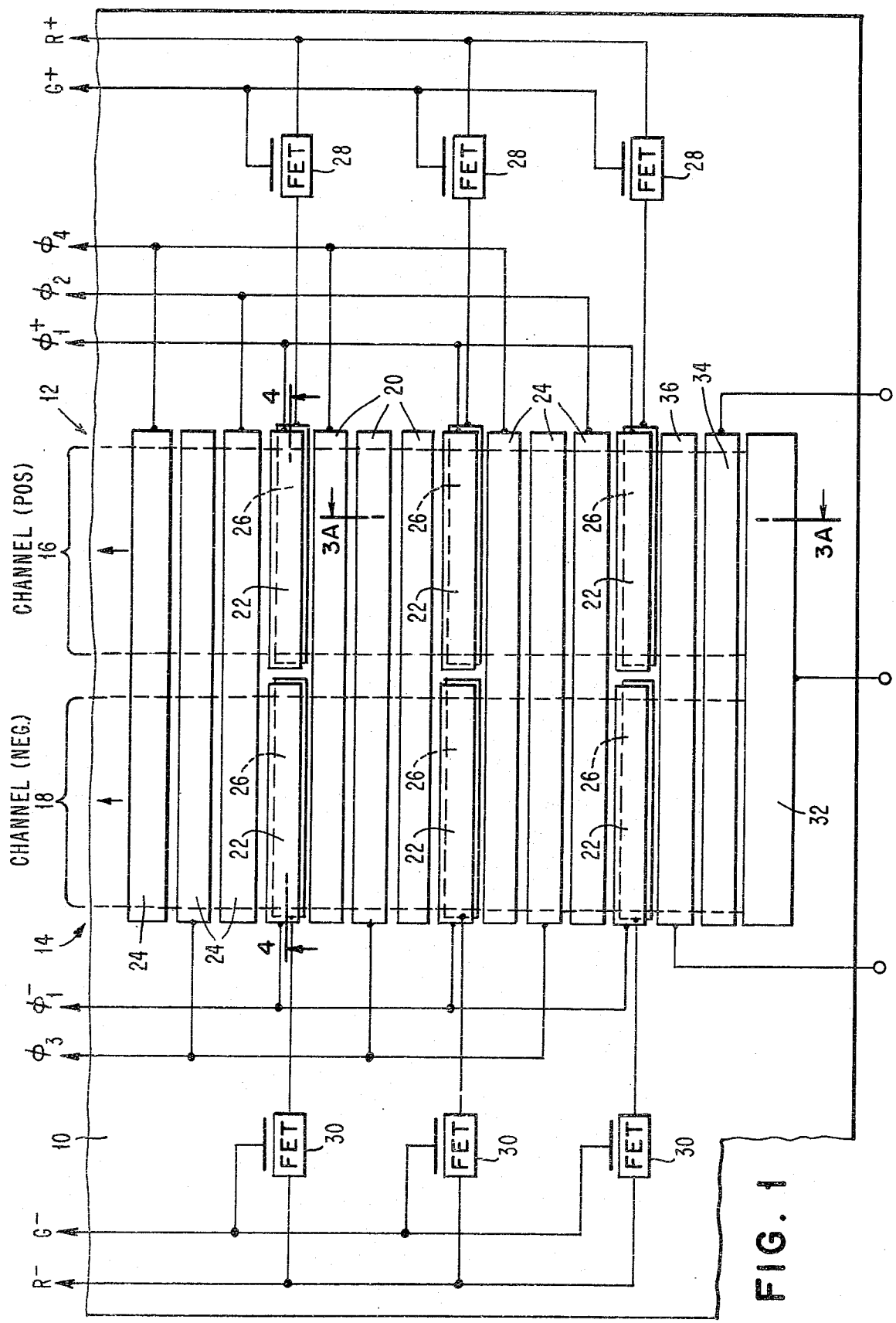
FIG. 1 schematically illustrates a charge transfer device transversal filter in accordance with a preferred embodiment of the invention.

With reference to the drawings, and for the present to FIG. 1, a charge transfer device transversal filter is illustrated in accordance with a preferred embodiment of the invention. On a suitable common substrate 10 are first and second equivalent charge transfer analog shift registers 12 and 14. Registers 12 and 14 comprise separate charge transfer channels 16 and 18, respectively, which may be formed by any of the conventional lateral confinement technique. Such techniques are described in more detail, for example, at pages 42–44 of CHARGE TRANSFER DEVICES by C. H. Sequin and M. F. Tompsett, Academic Press, Inc. (1975). Since the preferred embodiment employs many conventional charge transfer techniques which may be more fully understood from this book, particularly relevant portions thereof will be specifically identified and are herein formally incorporated by reference.

Insulatingly overlying each charge transfer channel 16 and 18 and insulated therefrom are a multiplicity of charge transfer electrodes 20 forming a plurality of successive charge transfer stages. Each such stage of register 12 has a corresponding stage in register 14, corresponding pairs of stages being physically located adjacent to each other for convenience in making common electrical connections. Each stage comprises four transfer electrodes corresponding with the four phase clocking system comprising clock lines $\phi_1$, $\phi_2$, $\phi_3$ and $\phi_4$. Other polyphase clocking techniques can be utilized, of course, which might involve more or less phases and other types of transfer electrodes as described in more detail in CHARGE TRANSFER DEVICES, supra, pp. 19–42. Two and three phase clocks and corresponding numbers of transfer electrodes are typical, for example. One of the transfer electrodes 20 of each stage is a sensing electrode 22. Corresponding transfer electrodes 20 which are non-sensing (that is which are not sensing electrodes 22) are electrically connected to each other, which may be done conveniently by positioning the two corresponding transfer electrodes adjacently and forming them together as one continuous electrode. The non-sensing electrodes 24 in FIG. 1 have been formed in this fashion.

Underlying each sensing electrode 22 and substantially coextensive therewith is a floating electrode 26. The floating electrodes 26 are insulated from the overlying sensing electrodes 22 as well as from the underlying substrate 10. Each floating electrode 26 of register 12 is electrically connected through a separate field effect transistor (FET) 28 to a common line R+. The gate electrodes of FETs 28 are all connected to a common gate line G+. Each floating electrode 26 of register 14 is electrically connected through a separate field effect transistor 30 to a common line R−. The gate electrodes of FETs 30 are all connected to a common gate line G−. Clock line $\phi_1$ is split into two parallel and synchronously operating portions $\phi_1{}^+$ and $\phi_1{}^-$, both of which are driven from the same clock source and receive the same clock voltages. However, different clock currents flow in these two clock lines $\phi_1{}^+$ and $\phi_1{}^-$ for reasons which will become more apparent shortly, and the integrated or accumulated difference between these currents is the output signal of the transversal filter. Thus clock line $\phi_1$ must be split. Clock line $\phi_1{}^+$ is connected to common to each sensing electrode 22 of register 12, while clock line $\phi_1{}^+$ is connected in common to each sensing electrode 22 of register 14. Clock lines $\phi_2$, $\phi_3$ and $\phi_4$ are electrically connected, respectively, to the other transfer electrodes in each stage for clocking electrical charge along the charge transfer channels 16 and 18 from stage to stage.

Figure 2:
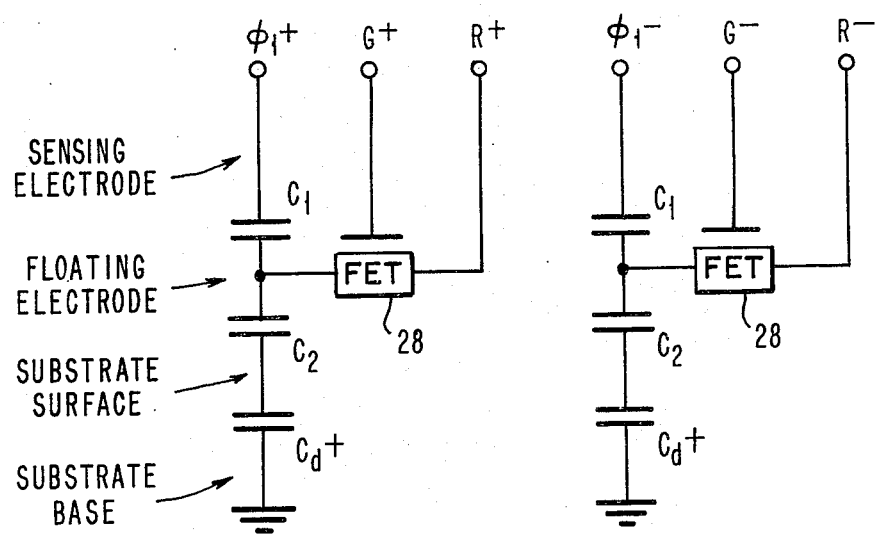
FIG. 2 schematically shows the series capacitance relationships resulting from the floating electrode configuration.

It can be readily seen that the configuration of a floating electrode 26 insulatingly sandwiched between a sensing electrode 22 and the substrate 10 may be viewed as three capacitances in series. FIG. 2 illustrates the three series capacitances for each of the two stages of a corresponding pair of stages, where $C_1$ is the capacitance per unit area between the respective sensing electrodes and the floating electrodes, $C_2$ is the capacitance per unit area between the respective floating electrodes and the substrate surface, and $C_d{}^+$ and $C_d{}^-$ are the respective depletion layer capacitances per unit area of the substrate under the floating electrodes. Now let $C_{ox}$ be the equivalent capacitance per unit area for the series combination, where $$\frac{1}{C_{ox}} = \frac{1}{C_1} + \frac{1}{C_2}$$

Assume the same charge Q is transferred into the depletion well under the floating electrodes of both of the corresponding stages. Current flow in the clock lines $\phi_1{}^+$ and $\phi_1{}^-$ now brings charge to the corresponding sensing electrodes equal to $Q_s{}^+$ and $Q_s{}^-$, respectively, where $$Q_s^+ = Q(\frac{C_{ox}}{C_{ox} + C_d^+}) \text{ and } Q_s^- = Q(\frac{C_{ox}}{C_{ox} + C_d^-})$$

The difference between $Q_s{}^+$ and $Q_s{}^-$ is $$Q_s^+ - Q_s^- = \frac{Q C_{ox}(C_d^+ - C_d^-)}{(C_{ox})^2 + C_{ox}(C_d^+ + C_d^-) + C_d^+ C_d^-}$$

If $C_d{}^+$ and $C_d{}^-$ are chosen so that $C_d^+ = C_D + \Delta C$ and $C_d^- = C_D - \Delta C$, then $$Q_s^+ - Q_s^- = \frac{2Q C_{ox} \Delta C}{(C_{ox})^2 + 2C_{ox}C_D + (C_D)^2 - (\Delta C)^2}$$

Then, neglecting the $(\Delta C)^2$ term $$Q_s^+ - Q_s^- = KQ\Delta C$$

where $$K = \frac{2C_{ox}}{(C_{ox})^2 + 2C_{ox}C_D + (C_D)^2}$$

Thus, the resulting charge difference on the sensing electrodes is proportional to the charge transferred into the associated depletion regions times an additional weighting factor equal to the difference between the effective depletion layer capacitances. It is well recognized that depletion layer capacitance varies with the voltage applied across the layer. Different voltages are therefore applied across the respective depletion layers under the sensing electrodes of corresponding stages by charging the associated floating electrodes to different voltages. The floating electrodes effectively bias the depletion layers differently to produce a difference in effective depletion capacitance.

The floating electrodes are charged to desired voltages with the FETs 28, 30. It is possible to individually charge or set the voltages of the floating electrodes by applying appropriate individual potentials to individual floating electrodes through individually controlled FETs, either serially or in parallel. However, the preferred method and the one shown in FIG. 1 does not require individual control of the FETs. Instead, charge signals are clocked into the wells under the floating electrodes, and then the FETs are opened together by appropriate potential on the gates thereof via line G+ or G−, respectively, to apply the same potential to the floating electrodes simultaneously via line R+ or R−, respectively. The registers 12 and 14 are programmed at different times in FIG. 1 because the input structure shown and the clocking system do not lend themselves to placing different charge signals into the registers simultaneously. During ordinary operation, the transversal filter processes identical charge signals in both registers 12 and 14. Thus, the input structure and clocking system are adapted to this type of operation. During programming of the weighting factors, separate signals may be clocked into the two registers and all of the floating electrodes programmed simultaneously if the input structure and clocking system lend themselves to this mode of operation, but such simultaneous programming is not required if the FETs serving the two registers may be opened and closed separately as shown in FIG. 1. Thus, the desired charge signal for programming the positive channel register 12 is clocked into register 12. It may or may not also be clocked into register 14 simultaneously, which does not matter. When the desired programming charge signal is present in register 12 under the respective floating electrodes, the gates of FETs 28 are opened to apply the same predetermined potential to all of the floating electrodes of register 12. In general, different amounts of charge flow to the different floating electrodes of register 12 depending upon the charge signal under each floating electrode. Then the FETs 28 are closed via line G+ and the floating electrodes of register 12 have been programmed or set. As long as the gates 28 are closed, the programmed amounts of charge are held on the floating electrodes of register 12 because they are now electrically isolated. It should be pointed out that when the programming charge signal is removed from register 12, the floating electrodes of register 12 move to different electrical voltage potentials dependent upon the amount of charge stored on the floating electrode, which amount of charge in turn has been determined by the associated charge signal during programming. The floating electrodes of register 14 are similarly programmed with lines R− and G− such that corresponding floating electrodes of a stage pair now have voltage potentials above and below a mean value which is the same for all pairs. It is not necessary that the more positive floating electrode of a pair be raised above the mean potential by the same amount that the less positive floating electrode of the pair is dropped below the mean. This is necessary only when the change in depletion layer capacitance with applied voltage is linear, which in general does not occur. It may be made linear, of course by appropriately profiling the doping of the substrate. A profiled doping may be made with ion implantation. Although a rigourous derivation will not be set forth here, a doping profile which varies as the inverse third power of the distance from the surface ($1/x^3$ where x is the distance from the substrate surface), seems to theoretically produce a linear relationship. For further detail with respect to the variation of depletion layer capacitance with applied voltage and doping levels, the reader is referred to Sze, PHYSICS OF SEMICONDUCTOR DEVICES, pages 84–96 and 370–372, Wiley (1969) which is hereby incorporated by reference. In general, the two floating electrodes of each stage pair are charged such that one causes a desired increase in depletion layer capacitance with respect to a predetermined mean capacitance while the other causes an equal decrease in depletion layer capacitance with respect to the mean capacitance.

Figure 3A:
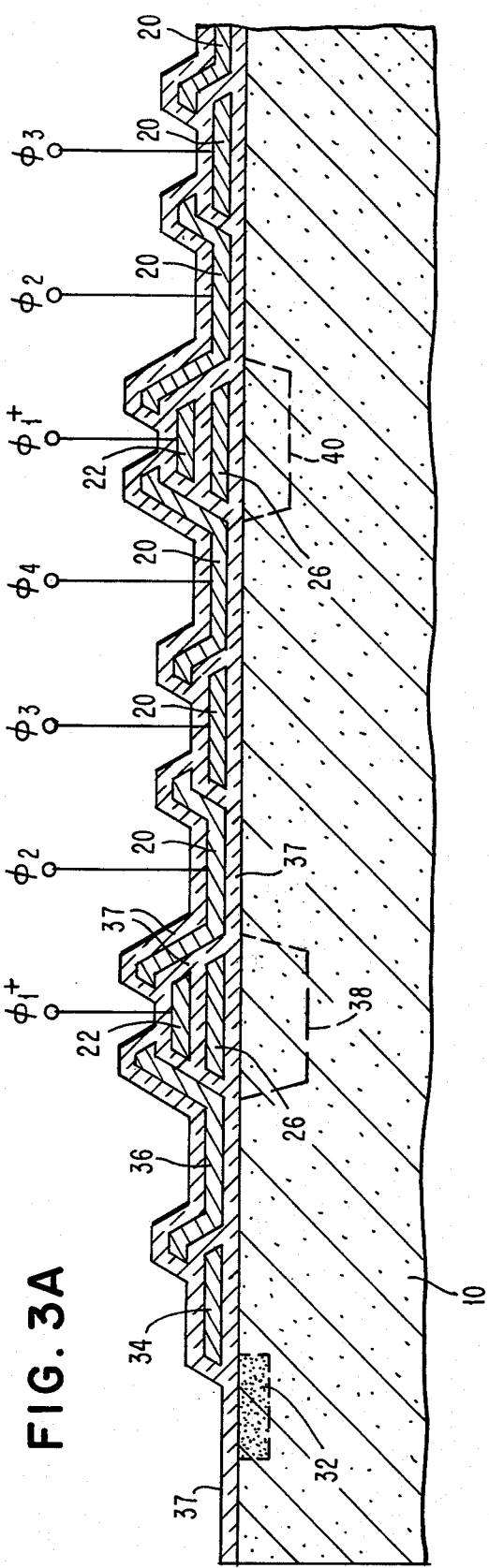
FIG. 3A is a partial sectional view of the preferred embodiment taken along the line indicated in FIG. 1.

Referring now to FIG. 3A which is a partial sectional view of the FIG. 1 embodiment taken along the line indicated in FIG. 1, an input diffusion 32 is used as a source for charge carriers. The input structure, which also includes electrodes 34 and 36, is constructed in a conventional manner and operates in a conventional manner, as will be readily understood by those in the art. For a more detailed description of the operation of this structure as well as a description of alternative input structures, the reader is referred to CHARGE TRANSFER DEVICES, supra, pages 47–52. The electrodes shown in FIG. 3A may be composed of polysilicon, while the substrate may be silicon, and the insulation 37 spacing electrodes from the substrate and from each other may be a silicon oxide. The lateral dimension in FIG. 3A is greatly compressed out of scale so that the electrodes appear to be much more narrow in width than occurs in reality. Electrode thicknesses may be on the order of 1 μm while electrode widths may be on the order of 8 μm. The insulation layers may be on the order of 500 nm thick. Thus, in reality, electrodes 22 and 26 are substantially coextensive.

Figure 4:
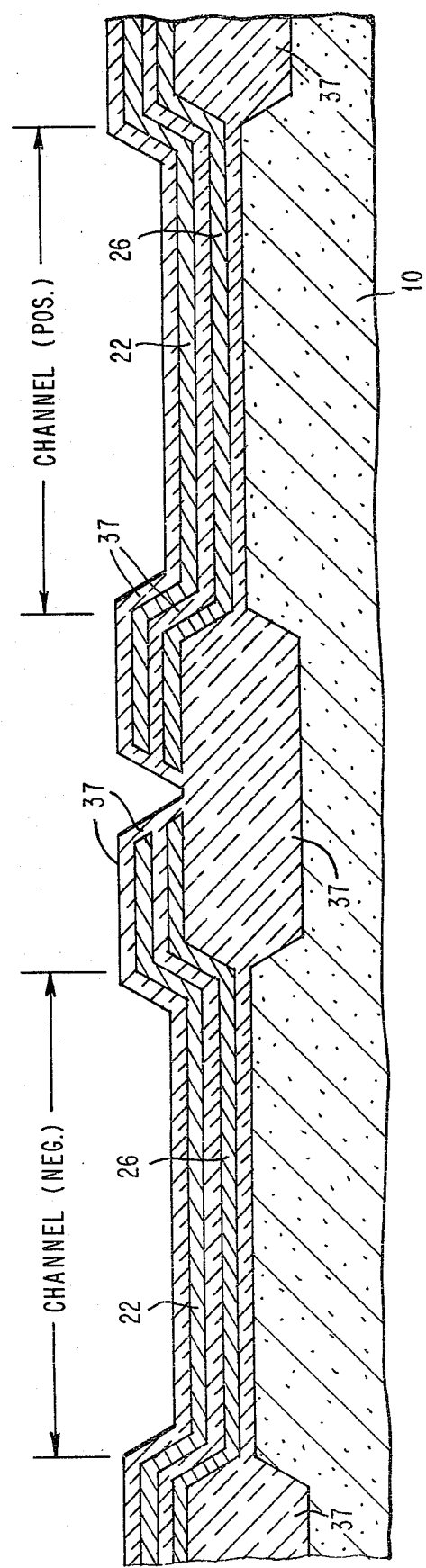
FIG. 4 is a partial sectional view of the preferred embodiment taken along the line indicated in FIG. 1.

FIG. 4 is a sectional view of the FIG. 1 embodiment taken along the line indicated in FIG. 1. Again, the lateral dimension is greatly compressed because the electrodes may have a length (width in FIG. 4) on the order of 100 μm.

Figure 3B:
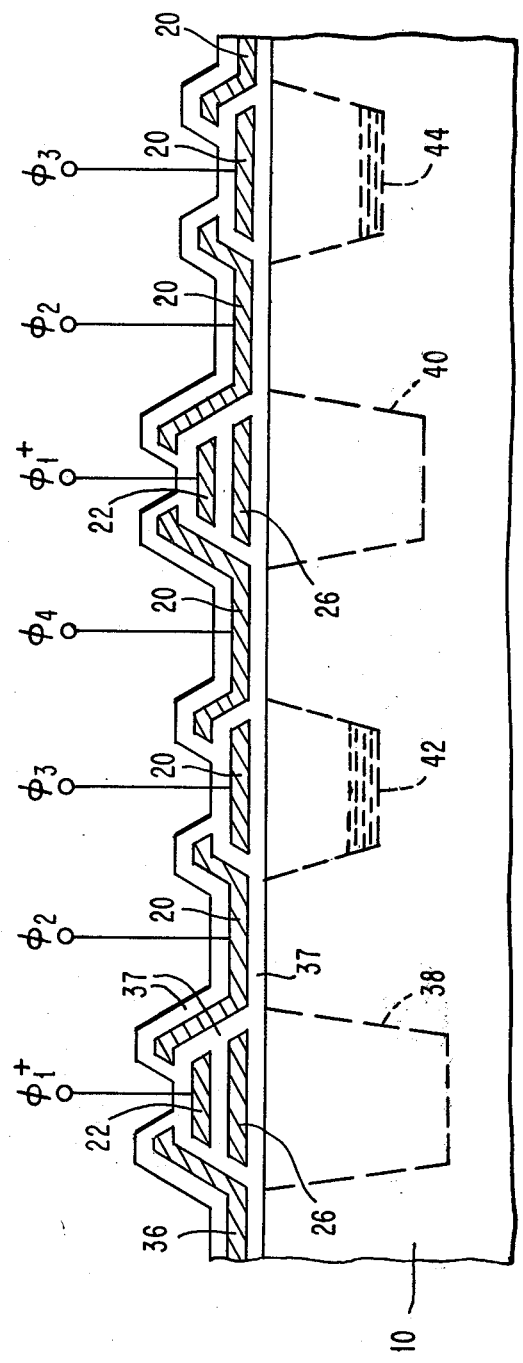

Referring back again to FIG. 3A, dotted regions 38 and 40 represent the effective depletion wells caused by charge isolated on the respective floating electrodes above said wells. The charge on these floating electrodes has been placed there in a manner already described. FIG. 3B shows the same structure when equal clocking voltages have been applied to lines $\phi_1{}^+$ and $\phi_3$, assuming linearity. The wells 38, 40 have become deeper by an amount equal to the wells 42, 44 formed under the $\phi_3$ electrodes. Within wells 42 and 44 are quantities of charge or charge packets schematically indicated by the shaded regions. The charge packets are generally not equal and are in general small in comparison with the size of the wells in order to achieve better linearity. No charge packet is in well 38 or in well 40.

FIG. 3C shows the same structure when clocking voltage is applied to $\phi_4$, and the $\phi_3$ voltage is dropping. The charge in well 42 is now transferred into well 40 as shown. The next charge packet is simultaneously flowing into well 38 and the charge packet in well 44 has flowed to the right out of view.

In FIG. 3D the clocking voltage on $\phi_3$ has been completely removed and the associated depletion region 42 has completely collapsed. All of the charge packet originally in well 42 has been transferred to the right where it may be entirely within well 40 or shared between well 40 and 46 depending upon the amount of bias provided by the floating electrode in relation to the size of the charge packet. If the charge packets are small relative to the wells, as preferred, the charge packets will have been entirely transferred to underneath the sensing electrodes as shown with respect to wells 38 and 40.

In FIG. 3E the clocking voltage on line $\phi_4$ has been removed, and the associated wells have completely collapsed assuring that the charge packets have by now completely moved into the wells underneath the sensing electrodes. While charge has been moving into the sensing electrode wells, charge has also been flowing to the sensing electrodes. This charge flow to the sensing electrodes is sensed elsewhere as will be explained in more detail below. The time frame during which this charge flow to the sensing electrodes occurs and must be measured is from FIG. 3B or shortly thereafter until FIG. 3E.

In FIG. 3F, clocking voltage has been applied to line $\phi_2$ and has been removed from line $\phi_1{}^+$. Depletion regions 38, 40 have collapsed back to the more shallow wells shown in FIG. 3A while the charge packets have moved to the right into corresponding wells 48, 50.

Figure 3G:
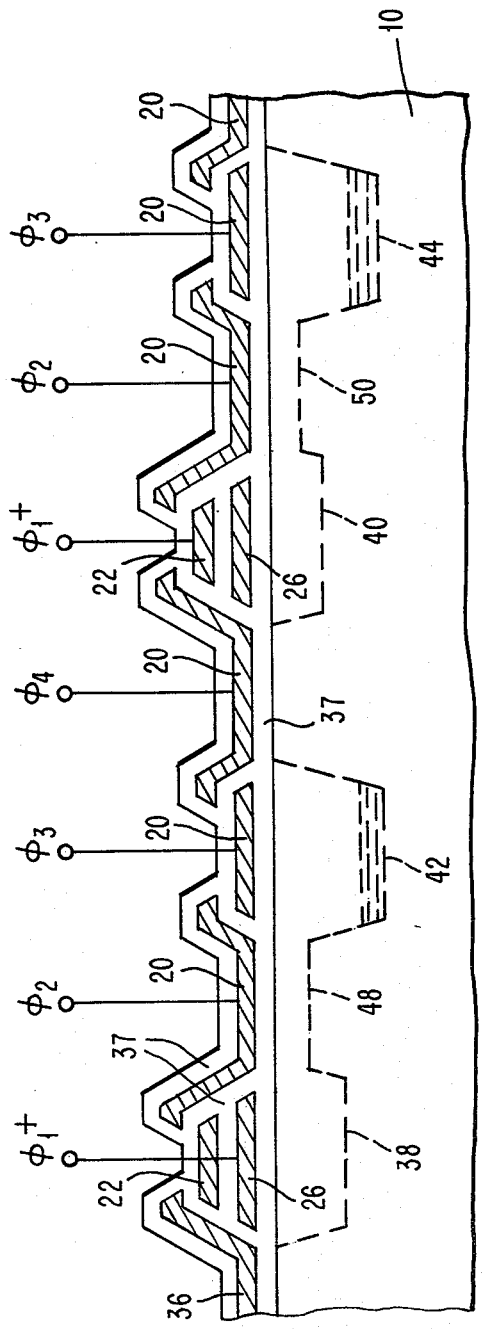

FIG. 3G shows wells 48, 50 now collapsing due to the removal of clocking voltage from line $\phi_2$. Clocking voltage has been applied to line $\phi_3$ again and wells 42 and 44 have been created again, but now contain different charge packets. The charge packet originally in well 42 has now moved completely over to well 44. Shortly hereafter clocking voltage will be applied to $\phi_1{}^+$ and the situation will again be as shown in FIG. 3B.

Figure 5:
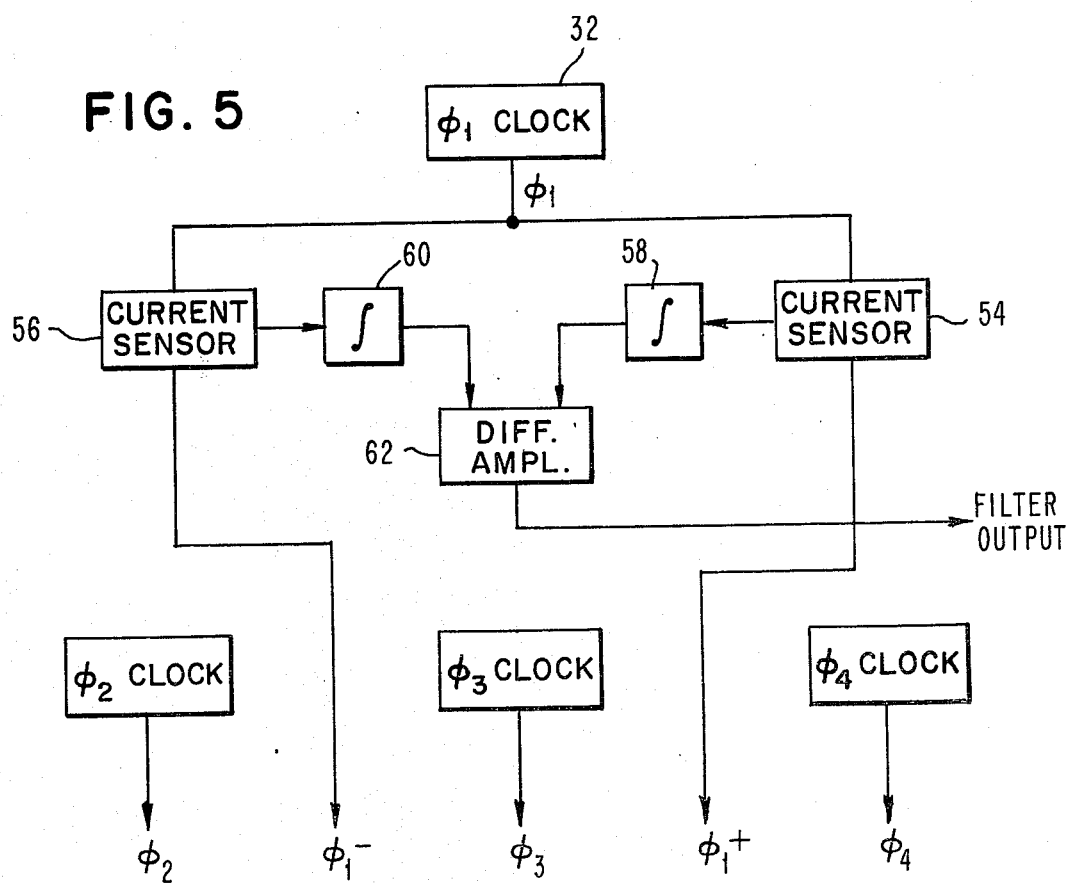
FIG. 5 is a block diagram of the sensing and polyphase clocking circuitry.

Referring now to FIG. 5, current sensors 54 and 56 detect or sense or measure the amount or amplitude of current supplied to clock lines $\phi_1{}^+$ and $\phi_1{}^-$, repsectively. The sensed currents are integrated by integrators 58 and 60 to produce signals quantitatively representative of the total sum of charge which has flowed to the sensing electrodes of registers 12 and 14, respectively, as a result of charge flowing into the depletion regions under said electrodes. The integrator signals are then subtracted in differential amplifier 62 to produce the filter output. The current sensing, integrating and subtracting functions may be accomplished in any known fashion. Suitable apparatus and techniques for accomplishing these functions are described, for example, in the aforesaid U.S. Pat. No. 3,819,958. However, the preferred method for accomplishing these functions is with charge coupled technology and charge replication techniques and apparatus described, for example, in copending U.S. application Ser. No. 625,425 filed Oct. 24, 1975 by L. G. Heller for "A Method and Apparatus for Replicating a Charge Packet", which is herein incorporated by reference.

It is preferred that equivalent registers 12 and 14 be constructed as nearly identically or symetrically as possible. Thus, corresponding sensing and floating electrodes are preferably equal in area and the charge transfer channels 16, 18 are preferably identical. It should be recognized, however, that the purpose in constructing the registers as nearly identical as possible is to assure that higher order terms, if there are any, will cancel each other during the differencing operation. Identical construction also facilitates accomplishment of the necessary requirement that both registers contain identical charge signals. If it can otherwise be assured that quantitatively the same input charge signals are inserted into both registers and that any non-cancelling higher order terms do not become significant, then the two registers need not be identical, nor even substantially identical. The two registers are considered to be equivalent if they do not introduce significant non-cancelling higher order terms due to physical differences in construction of the registers and if substantially equal charge signals can be inserted into them.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A charge transfer device transversal filter having controllable weighting factors, comprising:
    first and second equivalent charge transfer device analog shift registers, each forming a corresponding plurality of successive charge transfer stages thereby defining a plurality of pairs of corresponding charge transfer stages, each charge transfer stage having a plurality of transfer electrodes insulatingly overlying a suitable substrate, one of said transfer electrodes of each stage being a sensing electrode, said sensing electrode having a floating electrode insulatingly sandwiched between said sensing electrode and said substrate;
    means for controllably charging said floating electrodes of each pair of charge transfer stages relative to each other so as to define a selected weighting factor, the weighting factors of all pairs of charge transfer stages in combination defining a selected impulse response for the filter;
    means for applying input signals to said first and second shift registers for storage as electrical charge signals in successive ones of said stages, the same electrical charge signals being simultaneously stored in both stages of each of said pairs;
    means for applying phase related voltages to said charge transfer stages to effect transfer of charge from stage to stage within both said registers simultaneously and synchronously, the same phase related voltage being applied to all of said sensing electrodes; and
    means for producing an output signal representing the difference between the total charge flowing to said sensing electrodes of said first register and the total charge flowing to said sensing electrodes of said second register as a result of said stored electrical charge signals being transferred either into or out of the depletion regions associated with said sensing electrodes, said output signal being a weighted summation of said stored electrical charge signals.

* * * * *